United States Patent
Stanley-Marbell et al.

(10) Patent No.: US 10,135,471 B2
(45) Date of Patent: Nov. 20, 2018

(54) SYSTEM, METHOD, AND APPARATUS FOR REDUCING POWER DISSIPATION OF SENSOR DATA ON BIT-SERIAL COMMUNICATION INTERFACES

(71) Applicant: Massachusetts Institute of Technology, Cambridge, MA (US)

(72) Inventors: Phillip Stanley-Marbell, Boston, MA (US); Martin C. Rinard, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/612,485

(22) Filed: Jun. 2, 2017

(65) Prior Publication Data

US 2018/0048337 A1    Feb. 15, 2018

Related U.S. Application Data (60) Provisional application No. 62/344,625, filed on Jun. 2, 2016.

(51) Int. Cl.
| | |
|---|---|
| *H04B 1/02* | (2006.01) |
| *H04L 1/00* | (2006.01) |
| *H04N 19/156* | (2014.01) |
| *H03M 7/00* | (2006.01) |
| *H03M 7/14* | (2006.01) |

(52) U.S. Cl.
CPC ............... *H04B 1/02* (2013.01); *H03M 7/00* (2013.01); *H03M 7/14* (2013.01); *H04L 1/009* (2013.01); *H04L 1/0042* (2013.01); *H04N 19/156* (2014.11)

(58) Field of Classification Search
CPC .................. H04B 1/02; H04L 1/009
See application file for complete search history.

(56) References Cited

U.S. PATENT DOCUMENTS

| | | | |
|---|---|---|---|
| 8,942,309 B1 * | 1/2015 | Ware | H04L 25/14 |
| | | | 365/189.07 |
| 9,419,746 B1 * | 8/2016 | Baeckler | H04L 1/0001 |
| 2005/0197753 A1 * | 9/2005 | Miura | G07C 5/008 |
| | | | 701/45 |

OTHER PUBLICATIONS

Phillip Stanley-Marbell and Martin Rinard; Value-Deviation-Bounded Serial Data Encoding for Energy-Efficient Approximate Communication; Jun. 4, 2015.

* cited by examiner

*Primary Examiner* — Kabir A Timory
(74) *Attorney, Agent, or Firm* — Peter A. Nieves; Sheehan Phinney Bass & Green PA (57) ABSTRACT

A communication system receives a binary sequence from a sensor, identifies a power consuming characteristic of the binary sequence, and determines an error component configured to reduce the power consuming characteristic of the binary sequence. The system compares the error component to an error tolerance deviation, and if the error component is below the error tolerance deviation, combines the error component with the binary sequence to produce an output sequence and transmits the output sequence via a serial interface to a receiver configured to receive the output sequence. The error threshold is based in part on an error tolerance characteristic of the receiver.

4 Claims, 9 Drawing Sheets

FIG. 1

Algorithm 1: Outline of Rake algorithm for VDBS encoding.

```
/* First phase, from LSB to MSB; the transition count
   register, nt, stores count of transitions seen.     */
1 for nt ← 0, i ← 0, i < l, i ← i + 1 do
      /* If adjacent bits differ, store transition location in
         tr[].                                          */
      if (i < l − 1) and (s_i ≠ s_{i+1}) then
2         tr[nt] ← i
          if (nt > 0) then
              /* rl gets length of 0- or 1-run that transition
                 abuts; rc gets contrib.                */
3             rl ← tr[nt] − tr[nt − 1]
              rc ← (2^{rl} − 1) << tr[nt − 1]
          if (nt > 0) and (s_i = 0) then
              /* Store contrib. of run of 0s in cr0c.   */
4             cr0c[i] ← rc
          if (nt > 0) and (s_i = 1) then
              /* Store contrib. of run of 1s in cr1c.   */
5             cr1c[i] ← rc
          nt ← nt + 1
      else if i > 0 then
          /* Pad cumulative count arrays.               */
          cr0c[i] ← cr0c[i − 1]
6         cr1c[i] ← cr1c[i − 1]

/* Second phase, from MSB to LSB; inspect only the nt bit
     positions that have transitions.                   */
7 while nt > 0 do
      /* rl: run length; rc: run's contrib. if its bits were
         flipped to remove transition:                  */
      rl ← tr[nt] − tr[nt − 1]
      rc ← (2^{rl} − 1) << tr[nt − 1]
      /* Can deviation caused by negating bits be offset by
         negating runs of lower-order bits?:            */
8     if (s_{tr[nt−1]} = 0) and ((rc − cr1c[nt − 1]) ≤ m) then
          return (s + rc − cr1c[nt − 1])
9     if (s_{tr[nt−1]} = 1) and ((rc − cr0c[nt − 1]) ≤ m) then
          return (s − rc + cr0c[nt − 1])
      nt ← nt − 1
10 return s
```

SYSTEM, METHOD, AND APPARATUS FOR REDUCING POWER DISSIPATION OF SENSOR DATA ON BIT-SERIAL COMMUNICATION INTERFACES

CROSS-REFERENCE TO RELATED APPLICATIONS

This application claims the benefit of U.S. Provisional Patent Application Ser. No. 62/344,625, filed Jun. 2, 2016, entitled "Method and Apparatus for Reducing Power Dissipation on Bit-Serial Communication Interfaces," which is incorporated by reference herein in its entirety.

GOVERNMENT LICENSE RIGHTS

This invention was made with Government support under Contract No. FA8650-15-C-7564 awarded by the U.S. Air Force. The Government has certain rights in the invention.

FIELD OF THE INVENTION

The present invention relates to electronic circuitry, and more particularly, is related to serial communication devices.

BACKGROUND OF THE INVENTION

Wearable computing platforms such as health-tracking and head-mounted systems present new challenges to energy-efficient design. Unlike desktop and mobile systems, such platforms function primarily with their displays (if any) turned off. They spend a majority of their time reading data from sensors such as pressure sensors in elevation monitoring, accelerometers and gyroscopes in step counting applications, color/light sensors in pulse oximeter health applications, and cameras in head-mounted augmented-reality systems.

Sensor power dissipation is important. The processors in wearable, embedded, and mobile platforms are usually the main focus of power-reduction efforts. These processors are, however, often connected to many sensor integrated circuits (ICs). Because the power-efficiency for inter-IC communication may be limited by printed circuit board properties, power consumption of sensor circuits has not scaled with semiconductor process technology and packaging advances. As a result, the power dissipated in some state-of-the-art sensors may be nearly as high as the power dissipation of low-power processors.

Input/output (I/O) energy costs generally range from 10 fJ/bit/mm to 180 fJ/bit/mm in on-chip links, to between 2 pJ/bit and 40 pJ/bit for typical printed circuit board (PCB) traces. At data rates of 1 Mb/s typical of modern embedded serial links, these energy costs per bit lead to I/O power dissipation between 2 µW and 40 µW. This may represent a significant portion of power dissipation of a processor and such power dissipation is incurred for each sensor in a system. I/O energy thus presents a significant portion of power usage in many low-power embedded systems.

To enable smaller device packages, smaller PCB designs, and lower costs, the inter-IC communication links in many embedded computing platforms are bit-serial and not parallel buses. Prior efforts to reduce communication power by encoding data using techniques such as Gray coding have, however, targeted parallel buses and are not applicable to reduce data transfer power in bit-serial communication interfaces. Therefore, there is a need in the industry to address one or more of the above mentioned shortcomings.

SUMMARY OF THE INVENTION

Embodiments of the present invention provide method and apparatus for reducing power dissipation of sensor data on bit-serial communication interfaces. Briefly described, the present invention is directed to a communication system that receives a binary sequence from a sensor, identifies a power consuming characteristic of the binary sequence, and determines an error component configured to reduce the power consuming characteristic of the binary sequence. The system compares the error component to an error tolerance deviation, and if the error component is below the error tolerance deviation, combines the error component with the binary sequence to produce an output sequence and transmits the output sequence via a serial interface to a receiver configured to receive the output sequence. The error threshold is based in part on an error tolerance characteristic of the receiver.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Reference will now be made in detail to embodiments of the present invention, examples of which are illustrated in the accompanying drawings. Wherever possible, the same reference numbers are used in the drawings and the description to refer to the same or like parts.

As used herein, a "sequence" refers to an ordered set of data formed as binary bits, generally grouped into groups of a specific size, referred to herein as a word size, for example, an 8-bit or 16-bit word.

As used herein, a "serial interface" refers to a circuit component that transmits and/or receives data via a single data bus, such that data is transmitted and/or received one bit at a time, sent one bit after another in a series (hence "serial"). In contrast, a parallel interface refers to a circuit component that transmits and/or receives data multiple bits at a time, with a separate wire, lead, or trace for each bit in a transmitted/received word. An electrical serial data bus generally uses two voltage levels, namely, a high voltage level indicating a first bit value, and a low voltage level indicating a second bit value. For example, an electrical serial data bus may use a voltage level of 0V to represent a bit value of 0, and use a voltage level of 3V or 5V to represent a bit value of 1, while an optical serial bus (typically an optical fiber) may use a first illumination level to represent a bit value of 0, and use a second illumination level to represent a bit value of 1. As used herein, "signal transition" refers to the change of voltage or illumination on a serial data bus between a bit value of 0 and a bit value of 1, or between a bit value of 1 and a bit value of 0.

As used herein, "resolution" refers to the granularity of data, where higher resolution provides for a broader range of values for a single parameter than a lower resolution. For example, a single bit resolution only allows for two values (0 or 1), where an eight bit value allows 256 values (0-255), so an eight bit parameter has higher resolution than a one bit parameter.

As used within this disclosure, an "encoder" refers to a device, circuit, transducer, or software program that converts information (data) from one format or code to another, for example, to reduce the number of bit transitions in a transmitted value.

As used herein, "value-deviation" refers to the difference in value between an encoded value and an unencoded value. A value-deviation threshold may be used to cap the amount of value-deviation between encoded and unencoded values.

Exemplary embodiments of the present invention are directed to reducing power dissipated by electronic sensors. Data produced by electronic sensors is often generated by processes with some innate noise. Algorithms executed on processors that consume sensor data are usually robust to small or occasional errors, even if they typically require high-resolution data. Therefore, the exemplary embodiments herein employ value-deviation-bounded serial (VDBS) encoders. VDBS encoders reduce signal transitions and thereby reduce dynamic power dissipation on serial communication interfaces, by permitting a selectable amount of deviation from correctness in transmitted data. Otherwise stated, the VDBS encoders trade off a controlled amount of precision or accuracy for power conservation. Such efficient encodings may be computed offline and deployed, for example, using lookup tables, resulting in small overheads in practical applications.

VDBS-encoded values are generally interpreted as though they are not encoded. Therefore, VDBS does not require decoder hardware. Unlike previous encoding techniques, for example, TO encoding, VDBS encoders do not require additional circuit board components, for example, control wire on the bus. Because changes are not needed for the electrical interface or to the receive side of communication links, VDBS encoders may be integrated into production systems that use existing interfaces such as SPI and I2C.

The embodiments described below incorporate analytic formulas for VDBS encoders that may generate offline encoding tables. These encoders, embodiments of which are referred to herein as "optimal encoders," may be targeted to minimizing/optimizing a particular attribute, for example, transition reduction or deviation reduction. Another efficient VDBS encoder embodiment, Rake, is linear-time in input word size. Rake reduces transitions almost as much as the optimal transition-reducing VDBS encoder and induces almost as little deviation as the optimal deviation-reducing VDBS encoder.

In evaluations of the optimal encoder and Rake VDBS encoders, Rake reduced signal transitions by 67% on average when targeting a worst-case value deviation of 10% in 8-bit values. For target worst-case value deviations of 0.12% of the full-scale range for 16-bit values, Rake may reduce signal transitions by 41% on average. The evaluation results show that VDBS encoders reduce transitions more than simply representing values with shorter words of equivalent effective number of bits.

Serial interfaces transmit binary data consecutively, one bit after another. For example, an electrical signal may represent bits as two distinct voltage levels, and an optical signal may represent bits as two light intensity levels. The signal level does not change between two consecutive high or low bits, but does change (transition) between two consecutive differing bits, namely, a high-low (1 to 0) transition or low-high (0 to 1) transition. Dynamic power dissipation in serial interfaces occurs when consecutive serialized bits of the same word differ. Herein, the "serial transition count (STC)" refers to a number of such transitions between consecutive bits of the same word, for example, an eight bit word. Herein, "word" refers to any n-bit grouping of consecutive bits, for example, n=8, where n is referred to as the word size. Practically, the word size may be related to a system or device characteristic, for example, the bus design of the system, or the output resolution of an analog to digital converter (ADC), for example, 8<n<24.

Figure 1:
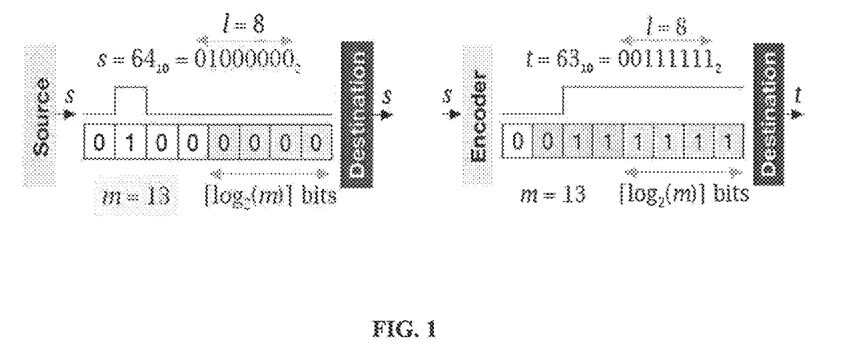
FIG. 1 is a schematic diagram showing an exemplary VDBS encoding.

The maximum STCs occur when words have alternating 0s and 1s in their binary representations. FIG. 1 shows how modifying transmitted words reduces the STC at the cost of small deviations from accuracy, where the value 64 (shown on the right) has an STC of 2, while the value of 63 (shown on the left) has an STC of 1. Therefore, by introducing a deviation in the transmitted value from 64 to 63, the STC is reduced from 2 to 1. VDBS encoding reduces transitions while incurring a value deviation, $|s-t|$, of 1, where s and t are two unsigned l-bit integers representing unencoded and encoded words, respectively. As shown in FIG. 1, all bits except the most-significant bit are modified (shown shaded in the right hand figure), not just the lower $\log_2(|s-t|)$ bits.

VDBS encoding generalizes the idea illustrated in FIG. 1. Considering both STC reduction and induced deviation, Pareto-optimal VDBS encoders either minimize the induced deviation, maximize the STC reduction, or both. For example, s and t are two unsigned l-bit integers representing unencoded and encoded words, respectively, m is the difference in numeric value between s and t, and $\#_\delta(k)$ represents the STC for an integer k. A Boolean predicate $P_{s,t,m}$ denotes the constraint satisfied by all VDBS encoders that maintain or reduce STCs while inducing a deviation less than or equal to m:

$$P_{s,t,m} = (|s-t| \leq m) \wedge ((\#\delta(s) - \#\delta(t)) \geq 0) \qquad \text{(Eq. 1)}$$

Figure 6:
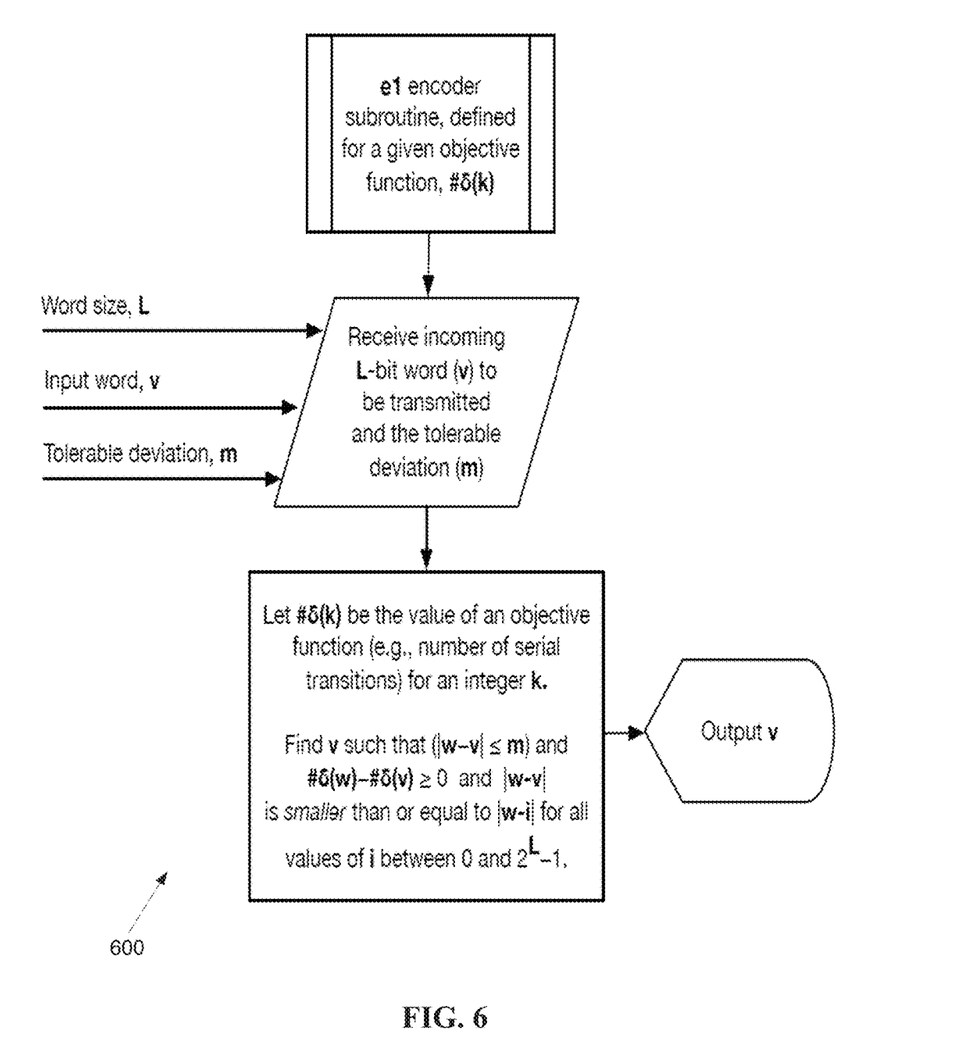
FIG. 6 is a flowchart of a detail of the method of FIG. 4 implementing encoder type $e_1$.
Figure 7:
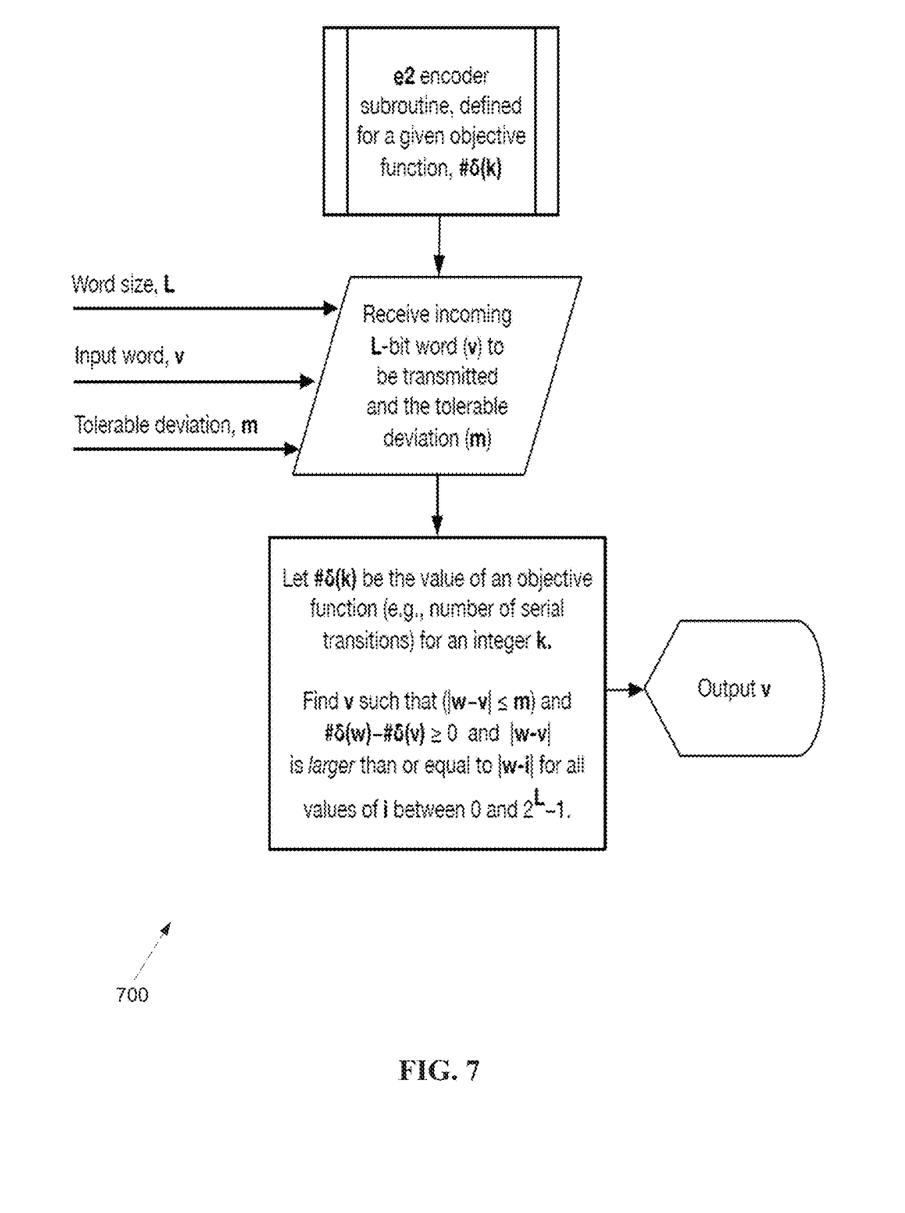
FIG. 7 is a flowchart of a detail of the method of FIG. 4 implementing encoder type $e_2$.
Figure 8:
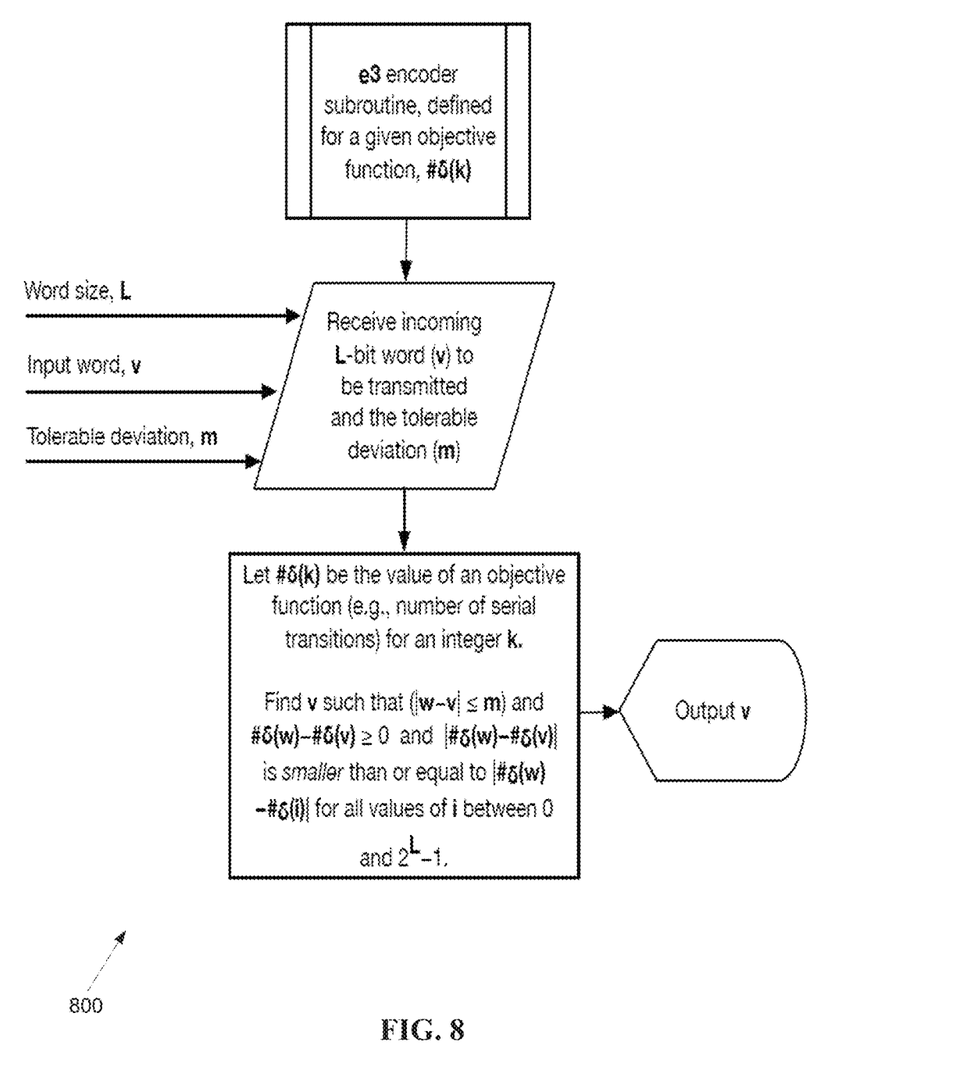
FIG. 8 is a flowchart of a detail of the method of FIG. 4 implementing encoder type $e_3$.
Figure 9:
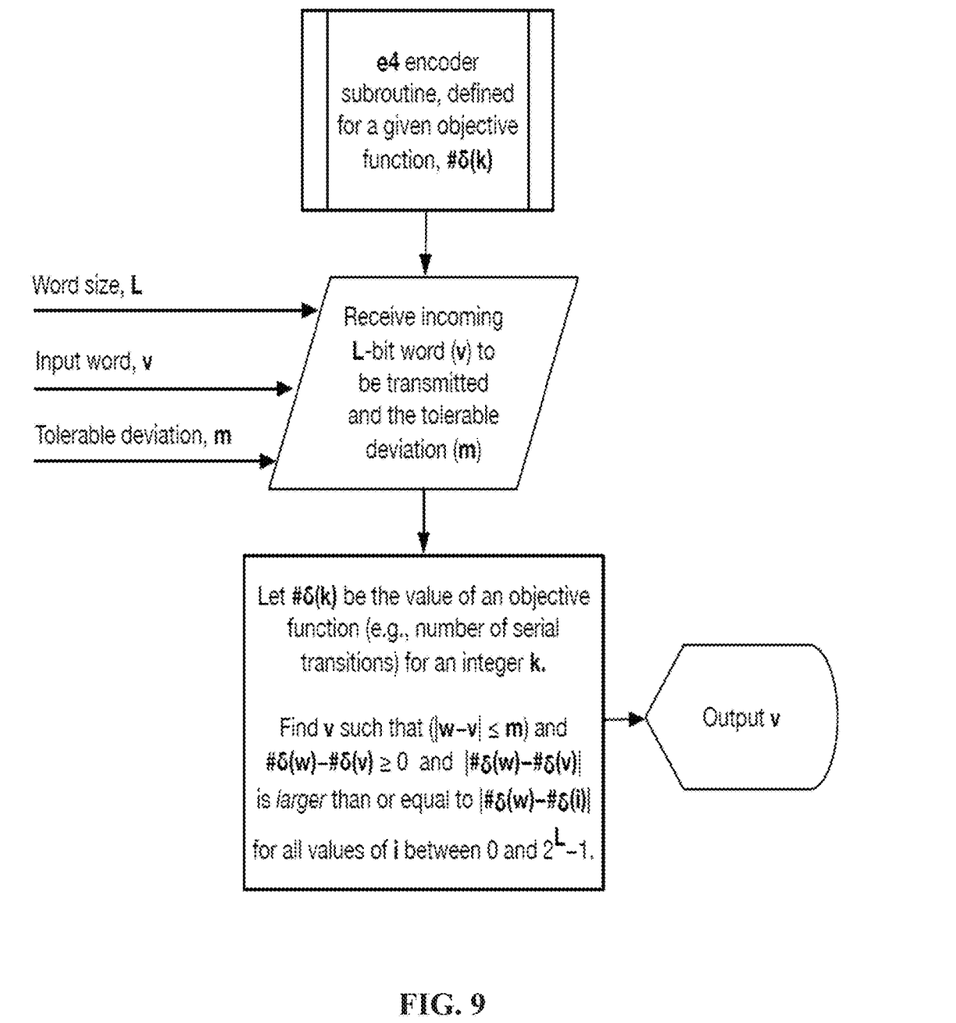
FIG. 9 is a flowchart of a detail of the method of FIG. 4 implementing encoder type $e_4$.

$\Delta s, t = |\#\delta(s) - \#\delta(t)|$ represents the difference in serial transition counts between two words s and t. Given an input word s and integer m indicating how much deviation in s is acceptable, there are four possible optimal encoding functions $e_1$-$e_4$ that satisfy the Boolean predicate $P_{s,t,m}$. These functions define the bounds on transition reduction and value deviation:

$$e_1(s, m) = \left(\tau \text{ s.t. } P_{s,\tau,m} \wedge \left(|s - \tau| = \min_{0 < i < 2^l - 1} |s - i|\right)\right),$$

$$e_2(s, m) = \left(\tau \text{ s.t. } P_{s,\tau,m} \wedge \left(|s - \tau| = \max_{0 < i < 2^l - 1} |s - i|\right)\right),$$

$$e_3(s, m) = \left(\tau \text{ s.t. } P_{s,\tau,m} \wedge \left(\Delta_{s,\tau} = \min_{0 < i < 2^l - 1} \Delta_{s,i}\right)\right),$$

$$e_4(s, m) = \left(\tau \text{ s.t. } P_{s,\tau,m} \wedge \left(\Delta_{s,\tau} = \max_{0 < i < 2^l - 1} \Delta_{s,i}\right)\right).$$

While the following examples involve unsigned integers, the analysis may be extended to two's-complement, fixed point, and floating point representations.

The four functions $e_1$ through $e_4$ bound the amount by which VDBS encoders reduce STCs and bound the deviation they induce:

$e_1(s, m)$ causes the smallest deviations.
$e_2(s, m)$ causes the largest deviations.
$e_3(s, m)$ reduces STCs the least.
$e_4(s, m)$ reduces STCs the most.

These functions may be used to obtain a method for VDBS encoding whose behavior encompasses the best of the properties of all the above encoders: induced deviation close to that of $e_1$ and STC reduction close to that of $e_4$.

The subset of three encoder types $e_1$, $e_3$, and $e_4$ are Pareto-optimal when considering both serial transition reduction and deviation. Because it is strictly dominated by $e_4$, the encoder $e_2$ is not in the Pareto set. The behavior of the simplistic encoder that for a given tolerable deviation m only removes transitions from the lower $\log_2(m)$ bits is similar to $e_2$.

Given an unencoded value s in which an application can tolerate a value deviation m, the family of optimal encoders $e_1$-$e_4$ specify the possible optimum ways in which encoding can reduce serial transitions in s. The optimal encoders $e_1$-$e_4$ also determine the amount of deviation that an encoding will induce for a given selected deviation that applications can tolerate. Exact algorithms for the optimal encoders $e_1$-$e_4$ select an encoded value for s out of a set whose size is exponential in the word size of s. A brute-force application of the predicate in Eq. 1 is therefore inefficient even if applied offline to generate a lookup table (LUT) and may be impractical for large word sizes, for example, word sizes of 64 bits or larger.

Rake, an efficient method for VDBS encoding, addresses the cost of the Pareto-optimal encoders, particularly for large word sizes. The execution time for Rake is linear in the word size of the values it encodes. For a specified deviation m in its encoded values, Rake reduces transitions more than the basic technique that simply removes all transitions from the lower-order $\log_2(m)$ bits. At the same time, Rake reduces transitions almost as much as the Pareto-optimal VDBS encoder $e_4$ that minimizes the serial transition count for a given tolerable deviation.

Figure 2:
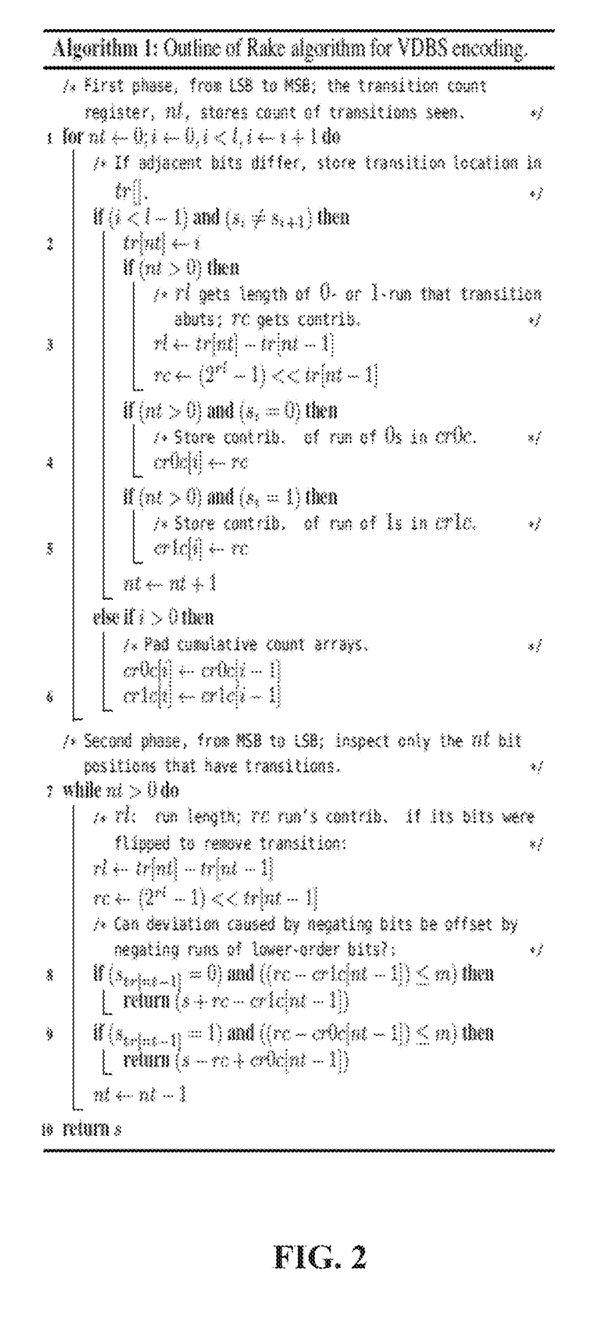
FIG. 2 is a listing of a pseudocode implementation of a Rake embodiment for VDBS encoding.

On average, Rake incurs value deviations smaller than all the Pareto-optimum VDBS encoders except $e_1$ (which minimizes value deviation). The embodiment is referred to as Rake because it operates in two sweeps of a word, accumulating metadata in the first sweep and leveling out transitions in the second. An exemplary implementation of Rake, shown in FIG. 2, is described here.

In the first phase (lines 1 to 6), moving across the l-bit input word s from least-significant bit (LSB) to most-significant bit (MSB), Rake stores the number of transitions seen to-date in the transition count register, nt. Rake stores the indices of these transitions in the transition indices array, tr (line 2). For each transition, Rake stores the length of the run of 0s or 1s leading to the transition, in the run length temporary register, rl (line 3). Each such run of 0s or 1s may be bit-wise negated to either increase or decrease the value of s. Rake stores the change in value that such a negation contributes in the cumulative run contribution arrays, cr0c for runs of 0s and cr1c for runs of 1s (lines 4 and 5).

In the second phase (lines 7 to 10), Rake moves across the input in the opposite direction, from MSB to LSB, inspecting only the nt bit positions that have transitions. Rake previously stored these locations in tr. For each of the nt transition locations in tr, Rake checks whether the value deviation incurred by negating the bits that constitute a transition could be offset by the runs of lower order bits of opposite polarity, as represented by the contents of cr0c and cr1c (lines 8 and 9). Rake removes the first transition that passes this check and completes. Rake takes l steps as it traverses from the LSB to the MSB, followed by at most nt−2 steps in the opposite direction. The maximum value of nt is l−1, thus Rake takes a maximum of 2l-3 steps. For example, for 24-bit values, Rake requires only on the order of, for example, 45 steps, compared to having to explore a space of 16 million values for the exact optimal solution.

Rake is not only efficient, but also effective: Rake reduces transitions almost as much as the optimal VDBS encoder $e_4$ as shown below. By contrast, the naive approach of simply removing transitions from the lower-order $\log_2(m)$ bits for a tolerable value deviation of m does not reduce transitions as much as Rake does.

Figure 3:
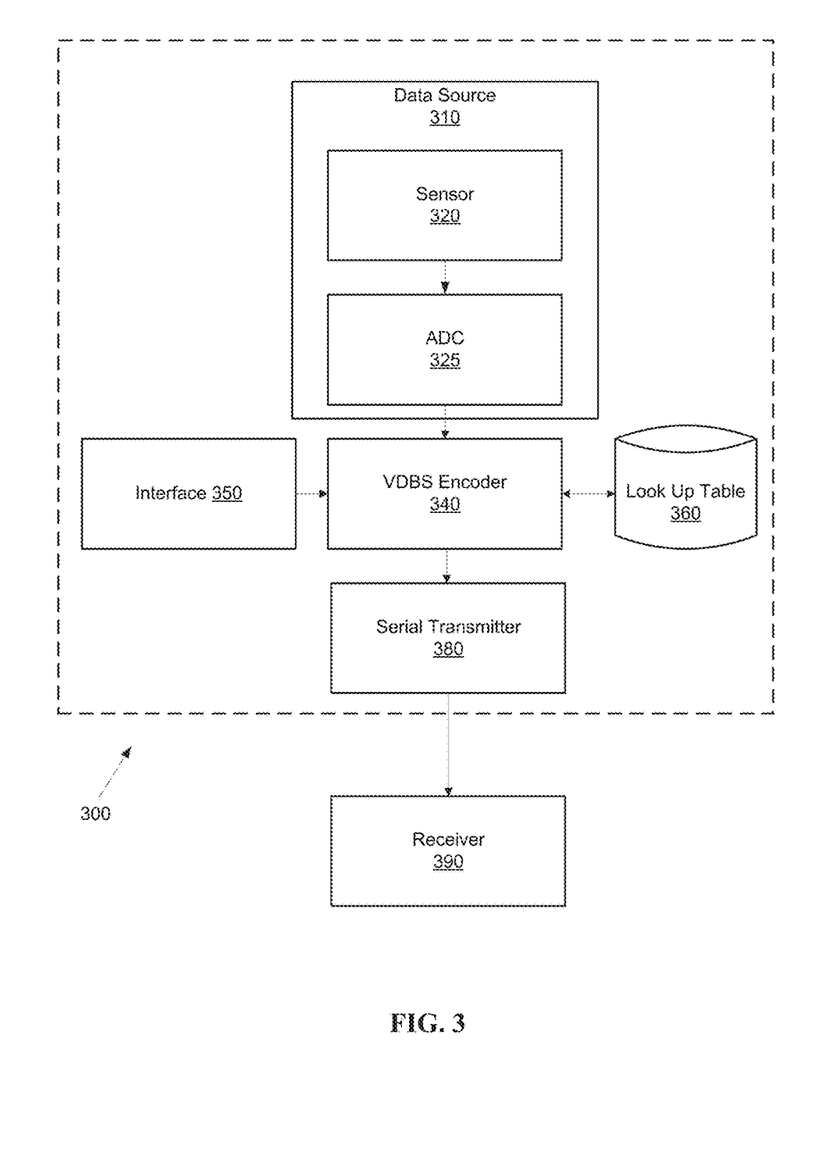
FIG. 3 is a block diagram of an exemplary embodiment of a device using a VDBS encoder.

FIG. 3 is a block diagram of an exemplary embodiment of an encoder device 300 using a VDBS encoder 340. A data source 310 produces data for serial transmission. The data source may be, for example, a sensor 320 that produces an analog signal that is converted to a digital representation by an ADC 325. The data source 310 may produce digital data of differing word sizes, for example, 8-bit or 16-bit words. The VDBS encoder 340 receives the word from the data source 310 and encodes the word, for example, using a look up table 360. The VDBS encoder 340 generally includes a processor and/or computer, as described further below, or may be implemented using a custom-designed logic circuit. The VDBS encoder 340 may accept input parameters from an optional interface 350. Such input parameters may include, for example, a word size and/or a tolerable deviation threshold. Alternatively, these parameters may be pre-defined, for example, stored in a memory in the VDBS encoder 340. A serial transmitter 380, or other serial interface, receives the encoded word from the VDBS, and serially transmits the encoded word to a receiver 390, for example, via a serial bus or optical fiber.

Two objective metrics are important for VDBS encoders:
1. The average serial transition count reduction for a given word size and tolerable deviation.
2. The average actual deviation that is induced by encoders for a given tolerable deviation.

Encoders may be evaluated, for example by applying the encoders to all possible unsigned words with sizes of 8 and 16 bits. These sizes are representative of the range of word sizes for sensor 320 and ADC 325 values used in real-world systems.

Data moving from processors to memories must often be transferred accurately. Techniques for reducing power dissipation on processor memory buses therefore employ substitution codes such as Gray codes, bus invert codes, or TO codes. In these prior approaches, data are recovered exactly after decoding. VDBS encoding, by contrast, requires no decoding, but is lossy. Because of crosstalk and pin limitations among other things, both state-of-the-art high-performance systems as well as energy sensitive wearable platforms predominantly use serial communication interfaces between ICs. Because serial interfaces transmit one bit of a word at a time, however, they cannot benefit from low-power encodings developed for parallel buses. Low-power encodings for serial video data exploit tonal locality in images to reduce transitions in exchange for data representation overheads. Other approaches to reducing transitions include representing values with fewer bits, or using transition encoding. VDBS encoders are more effective at reducing transitions than approaches that simply reduce the number of bits transmitted. Many signal processing and recognition, mining, and synthesis applications can tolerate errors in their input data. This motivates low-power encodings that trade sensor data accuracy for lower power dissipation.

Wearable and health-tracking devices dissipate important fractions of their energy on sensor activation and data transfer. Since package and circuit board capacitances do not improve with semiconductor process advances, the fraction will continue to grow relative to components such as processors. For reasons of space and cost, however, the data transfer happens over serial interfaces, not over parallel buses. This precludes encodings such as Gray codes. Value-deviation-bounded serial encoding (VDBS encoding) reduces the dynamic power dissipation of serial data communication when applications tolerate deviations in the data values being transmitted.

Evaluation results have shown that Rake performs close to optimal in reducing serial transitions. For one optical character recognition (OCR) system evaluated, Rake reduced signal transitions (and hence dynamic power dissipation of data transfer) by 55% on average, while maintaining OCR accuracy at over 90% for previously-correctly-recognized text. For one pedometer system evaluated, Rake reduced signal transitions by 54% on average, while causing less than 5% error in reported step counts, on average.

Figure 4:
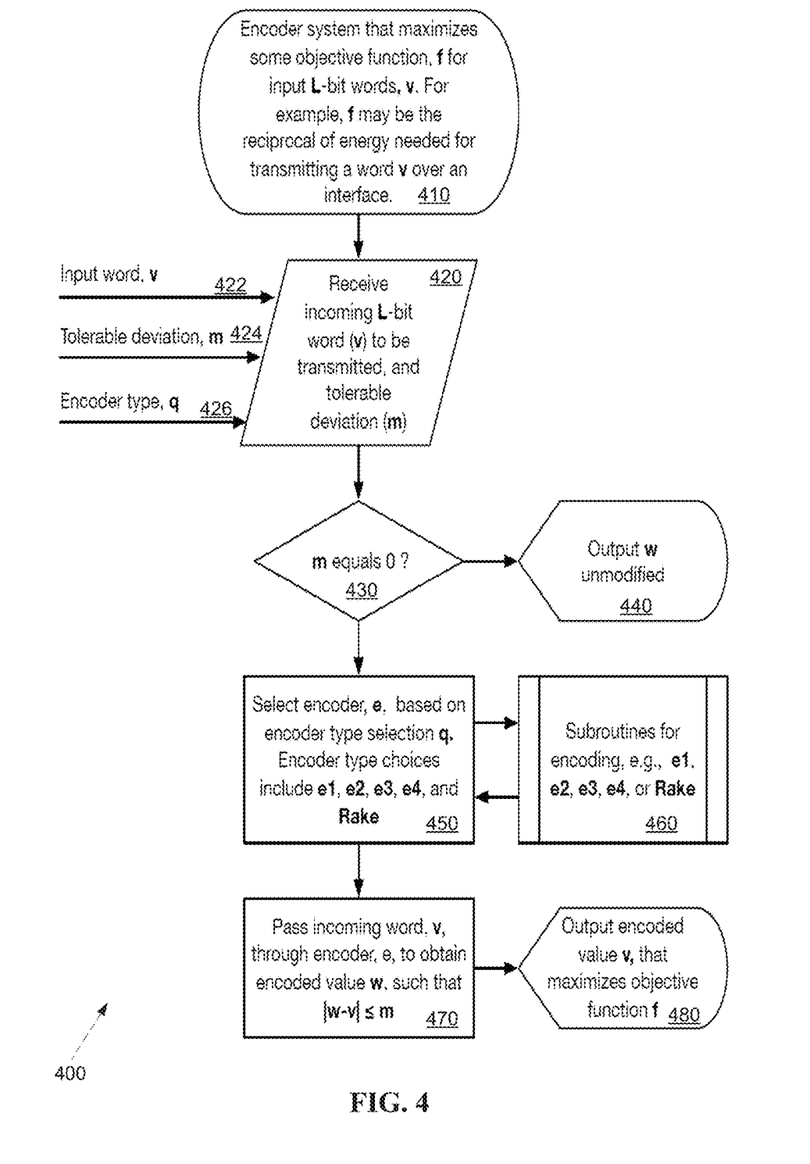
FIG. 4 is a flowchart of a method for reducing power in a data transmitting device.

FIG. 4 is a flowchart of a method 400 for reducing power in a data transmitting device. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The steps of the method 400 are described in context of the encoder device 300 (FIG. 3).

An encoder device 300 or system maximizes an objective function f for input L-bit words, v, as shown by block 410. For example, f may be the reciprocal of energy needed for transmitting a word v via a serial transmitter 380. A VDBS Encoder 340 receives an incoming L-bit word v 422 to be transmitted, a tolerable deviation m 424, and an encoder type q 426, as shown by block 420. The input word v may be received by the VDBS encoder 340, for example, from a data source 310. If the tolerable deviation m is equal to zero, as shown by block 430, the output w is unmodified, as shown by block 440. Otherwise, an encoder e is selected based on the encoder type selection q, as shown by block 450. The VDBS encoder 340 may be implemented, for example, using a look up table 360. As shown by FIG. 460, subroutines for each individual selection q may be executed. The individual subroutines are shown by FIG. 2 (Rake), FIG. 6 ($e_1$ 600), FIG. 7 ($e_2$ 700), FIG. 8 ($e_3$ 800), and FIG. 9 ($e_4$ 900), respectively. For each of FIGS. 6-9 the encoder receives an incoming L-bit word v to be transmitted, and a tolerable deviation m. The incoming word v, is passed through the selected encoder to obtain an encoded value w, such that $|w-v| \leq m$, as shown by block 470. The encoded value v that maximizes the objective function f is output by the serial transmitter 380, as shown by block 480. The $e_1$ encoder 600 produces a word v that results in the smallest deviations. The $e_2$ encoder 700 produces a word v resulting in the largest deviations. The $e_3$ encoder 800 produces a word v that reduces STCs the least. The $e_4$ encoder 900 produces a word v that reduces STCs the most.

Figure 5:
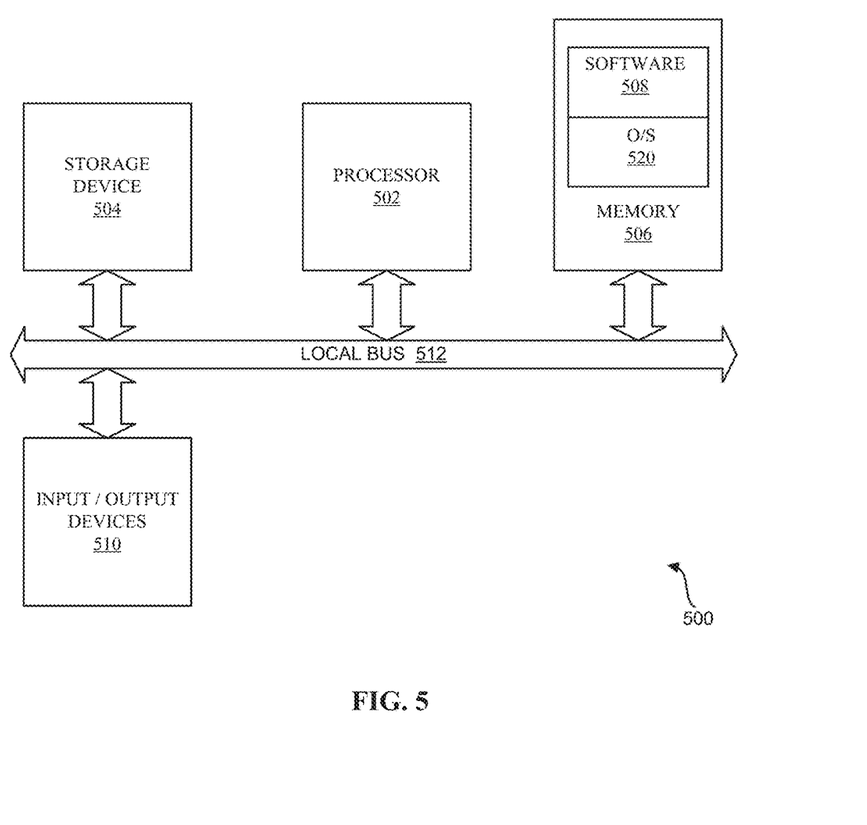
FIG. 5 is a schematic diagram illustrating an example of a system for executing functionality of the present invention.

As previously mentioned, the present system for executing the functionality described in detail above may be a computer, an example of which is shown in the schematic diagram of FIG. 5. The system 500 contains a processor 502, a storage device 504, a memory 506 having software 508 stored therein that defines the abovementioned functionality, input and output (I/O) devices 510 (or peripherals), and a local bus, or local interface 512 allowing for communication within the system 500. The local interface 512 can be, for example but not limited to, one or more buses or other wired or wireless connections, as is known in the art. The local interface 512 may have additional elements, which are omitted for simplicity, such as controllers, buffers (caches), drivers, repeaters, and receivers, to enable communications. Further, the local interface 512 may include address, control, and/or data connections to enable appropriate communications among the aforementioned components.

The processor 502 is a hardware device for executing software, particularly that stored in the memory 506. The processor 502 can be any custom made or commercially available single core or multi-core processor, a central processing unit (CPU), an auxiliary processor among several processors associated with the present system 500, a semiconductor based microprocessor (in the form of a microchip or chip set), a macroprocessor, or generally any device for executing software instructions.

The memory 506 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 506 may incorporate electronic, magnetic, optical, and/or other types of storage media. Note that the memory 506 can have a distributed architecture, where various components are situated remotely from one another, but can be accessed by the processor 502.

The software 508 defines functionality performed by the system 500, in accordance with the present invention. The software 508 in the memory 506 may include one or more separate programs, each of which contains an ordered listing of executable instructions for implementing logical functions of the system 500, as described below. The memory 506 may contain an operating system (O/S) 520. The operating system essentially controls the execution of programs within the system 500 and provides scheduling, input-output control, file and data management, memory management, and communication control and related services.

The I/O devices 510 may include input devices, for example but not limited to, a keyboard, mouse, scanner, microphone, etc. Furthermore, the I/O devices 510 may also include output devices, for example but not limited to, a printer, display, etc. Finally, the I/O devices 510 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the system 500 is in operation, the processor 502 is configured to execute the software 508 stored within the memory 506, to communicate data to and from the memory 506, and to generally control operations of the system 500 pursuant to the software 508, as explained above.

When the functionality of the system 500 is in operation, the processor 502 is configured to execute the software 508 stored within the memory 506, to communicate data to and from the memory 506, and to generally control operations of the system 500 pursuant to the software 508. The operating system 520 is read by the processor 502, perhaps buffered within the processor 502, and then executed.

When the system 500 is implemented in software 508, it should be noted that instructions for implementing the system 500 can be stored on any computer-readable medium for use by or in connection with any computer-related device, system, or method. Such a computer-readable medium may, in some embodiments, correspond to either or both the memory 506 or the storage device 504. In the context of this document, a computer-readable medium is an electronic, magnetic, optical, or other physical device or means that can contain or store a computer program for use by or in connection with a computer-related device, system, or method. Instructions for implementing the system can be embodied in any computer-readable medium for use by or in connection with the processor or other such instruction execution system, apparatus, or device. Although the processor 502 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the system 500 is implemented in hardware, the system 500 can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In summary, while the previous embodiments have generally described encodings intended to reduce the number of bit transitions in a serial interface, persons with ordinary skill in the art will recognize that similar encodings may be tailored to other outcomes. For example, it may be desirable to minimize the number of transmitted 1s (or 0s), for instance, to reduce energy consumption of a laser transmitter in a fiber optic interface, or other serial interfaces.

The embodiments described above actually improve the operation of a sensor device or sensor based system, by reducing the power consumption profile of such sensor devices and sensor based systems without having to modify the sensor itself, and without having to provide decoding facilities.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for reducing power in a data transmitting device, comprising the steps of:
   receiving a binary sequence by the data transmitting device;
   identifying a power consuming characteristic of the binary sequence;
   determining an error component configured to reduce the power consuming characteristic of the binary sequence;
   combining the error component with the binary sequence to produce an output sequence;
   transmitting the output sequence via a serial interface; and
   further comprising a first phase comprising the steps of:
      checking each bit in a word of the binary sequence beginning from the least significant bit (LSB) to the most significant bit (MSB);
      detecting a bit transition in the word; and
      for each bit transition:
         incrementing a stored number of bit transitions;
         storing an index indicating the location of the bit transition;
         storing a length of a run of 0s or 1s leading to the bit transition;
         negating the run of 0s or 1s; and
         accumulating a deviation in value resulting from negating the run.

2. The method of claim 1, further comprising a second phase comprising the step of beginning from the MSB of the word and proceeding to the LSB, at each stored index removing the negating if the value deviation incurred by negating the run is offset by the runs of lower order bits of opposite polarity.

3. A communication system comprising:
   a transmitter comprising a processor and a memory configured to store non-transitory instruction that when executed by the processor perform the steps comprising:
      receiving a binary sequence;
      identifying a power consuming characteristic of the binary sequence;

determining an error component configured to reduce the power consuming characteristic of the binary sequence;

comparing the error component to an error tolerance deviation;

if the error component is below the error tolerance deviation, combining the error component with the binary sequence to produce an output sequence; and transmitting the output sequence via a serial interface; and a receiver configured to receive the output sequence, wherein the error threshold of the transmitting device is based in part on an error tolerance characteristic of the receiving device, wherein the processor is further configured to perform the steps of:

a first phase comprising the steps of:

checking each bit in a word of the binary sequence beginning from the least significant bit (LSB) to the most significant bit (MSB);

detecting a bit transition in the word;

for each bit transition:

incrementing a stored number of bit transitions;

storing an index indicating the location of the bit transition;

storing a length of a run of 0s or 1s leading to the bit transition;

negating the run of 0s or 1s; and accumulating a deviation in value resulting from negating the run; and a second phase comprising the step of:

beginning from the MSB of the word and proceeding to the LSB, at each stored index removing the negating if the value deviation incurred by negating the run is offset by the runs of lower order bits of opposite polarity.

4. A serial communication interface device comprising:

a memory and a processor configured to execute non-transitory instruction stored in the memory to receive a binary sequence and produce an output sequence configured to reduce a power consuming characteristic of the binary sequence; and a serial interface configured to transmit the output sequence, wherein the processor is further configured to perform the steps of:

a first phase comprising the steps of:

checking each bit in a word of the binary sequence beginning from the least significant bit (LSB) to the most significant bit (MSB);

detecting a bit transition in the word;

for each bit transition:

incrementing a stored number of bit transitions;

storing an index indicating the location of the bit transition;

storing a length of a run of 0s or 1s leading to the bit transition;

negating the run of 0s or 1s; and accumulating a deviation in value resulting from negating the run; and a second phase comprising the step of:

beginning from the MSB of the word and proceeding to the LSB, at each stored index removing the negating if the value deviation incurred by negating the run is offset by the runs of lower order bits of opposite polarity.

* * * * *